United States Patent
Fornage

(10) Patent No.: US 9,137,916 B2
(45) Date of Patent: Sep. 15, 2015

(54) METHOD AND APPARATUS FOR POTTING AN ELECTRONIC DEVICE

(71) Applicant: Enphase Energy, Inc., Petaluma, CA (US)

(72) Inventor: Martin Fornage, Petaluma, CA (US)

(73) Assignee: Enphase Energy, Inc., Petaluma, CA (US)

(*) Notice: Subject to any disclaimer, the term of this patent is extended or adjusted under 35 U.S.C. 154(b) by 187 days.

(21) Appl. No.: 13/751,350

(22) Filed: Jan. 28, 2013

(65) Prior Publication Data
US 2013/0135802 A1    May 30, 2013

Related U.S. Application Data

(63) Continuation of application No. 12/657,071, filed on Jan. 13, 2010, now Pat. No. 8,360,390.

(60) Provisional application No. 61/204,929, filed on Jan. 13, 2009.

(51) Int. Cl.
*H01L 23/20* (2006.01)
*H05K 5/06* (2006.01)
*H05K 3/28* (2006.01)

(52) U.S. Cl.
CPC ............... *H05K 5/064* (2013.01); *H05K 3/284* (2013.01); *H05K 2203/1316* (2013.01)

(58) Field of Classification Search
CPC ..................................................... H01L 23/20
USPC ............................. 257/682; 361/679.01–821
See application file for complete search history.

(56) References Cited

U.S. PATENT DOCUMENTS

| | | | |
|---|---|---|---|
| 3,381,930 A | 5/1968 | Gruenstein | |
| 3,444,399 A | 5/1969 | Jones | |
| 3,584,106 A | 6/1971 | Miller | |
| 3,909,504 A | 9/1975 | Browne | |
| 4,109,373 A | 8/1978 | Fennessy et al. | |
| 4,286,302 A | 8/1981 | Owens et al. | |
| 5,407,505 A | 4/1995 | Groenewegen et al. | |
| 5,755,026 A | 5/1998 | Stephan et al. | |
| 5,959,842 A | 9/1999 | Leonard et al. | |
| 6,319,448 B1 | 11/2001 | Kirchdoerffer et al. | |
| 6,395,585 B2 | 5/2002 | Brandl | |
| 6,583,355 B2* | 6/2003 | Skrzypchak | 361/752 |
| 6,680,435 B1 | 1/2004 | Ogawa et al. | |
| 6,791,174 B2* | 9/2004 | Matsuo et al. | 257/680 |
| 6,986,454 B2 | 1/2006 | Stillabower | |

(Continued)

OTHER PUBLICATIONS

Action controls: Potting Solutions, "Potting", Action Controls Inc., downloaded from web site http://www.actioncontrols.com/potting.htm, on Apr. 19, 2010, 1 pg.

*Primary Examiner* — Robert B Davis
(74) *Attorney, Agent, or Firm* — Moser Taboada

(57) ABSTRACT

Method and apparatus for potting an electronic device. In one embodiment, the method comprises providing an enclosure having a first inner volume with the electronic device disposed therein; placing a fill control element within the enclosure such that a second inner volume of the fill control element is fluidly coupled to the first inner volume; and filling a remaining portion of the first inner volume, the remaining portion not occupied by the electronic device or the fill control element, with a sealant such that air is trapped within at least a first portion of the second inner volume.

20 Claims, 4 Drawing Sheets

(56) References Cited

U.S. PATENT DOCUMENTS

| | | | |
|---|---|---|---|
| 7,099,157 B2 * | 8/2006 | Boer et al. | 361/721 |
| 2004/0012099 A1 | 1/2004 | Nakayama | |
| 2006/0034056 A1 * | 2/2006 | Oka et al. | 361/700 |
| 2009/0086455 A1 * | 4/2009 | Sakamoto et al. | 361/796 |

* cited by examiner

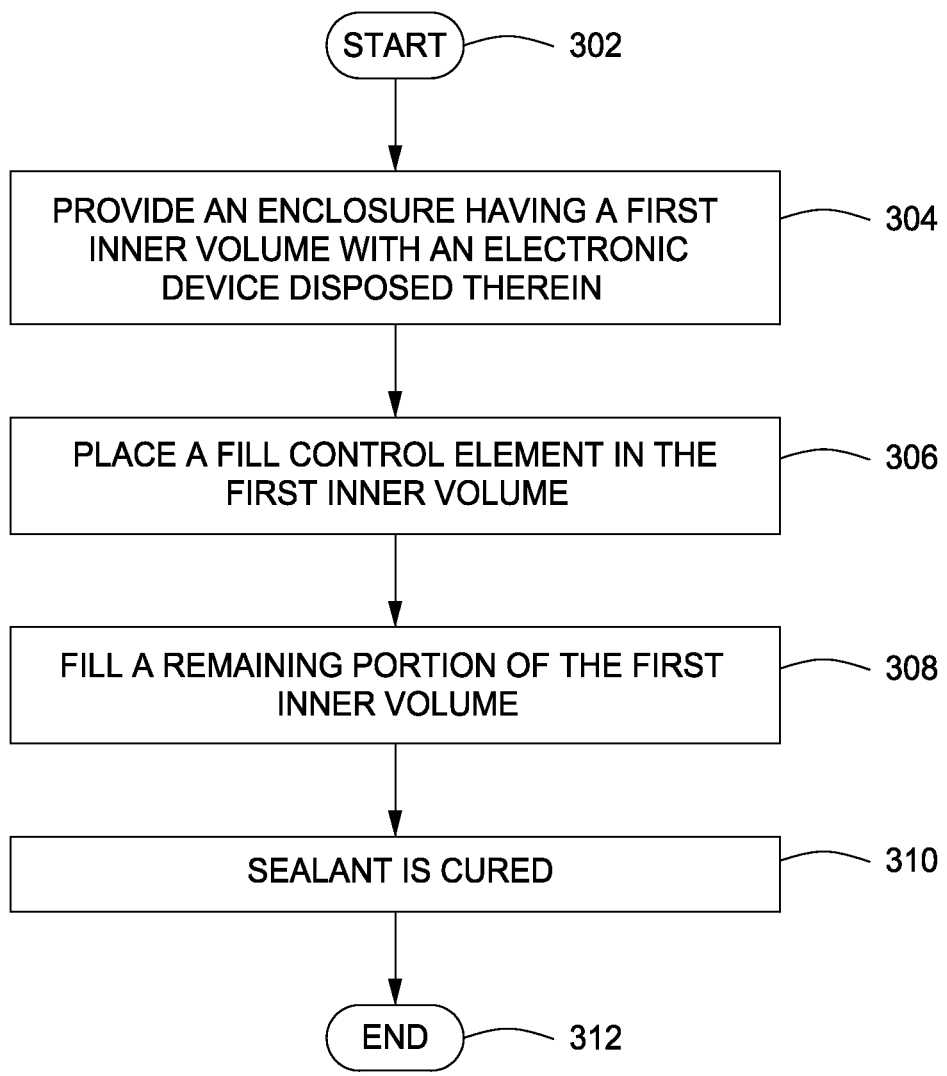

METHOD AND APPARATUS FOR POTTING AN ELECTRONIC DEVICE

CROSS-REFERENCE TO RELATED APPLICATIONS

The present invention is a continuation of co-pending U.S. patent application Ser. No. 12/657,071, filed Jan. 13, 2010, which claims the benefit of the U.S. provisional patent application Ser. No. 61/204,929, filed Jan. 13, 2009. Each of the aforementioned patent applications is herein incorporated in its entirety by reference.

BACKGROUND OF THE INVENTION

1. Field of the Invention

Embodiments of the present invention generally relate to an electronic device, and more particularly, relate to a method and apparatus for potting an electronic device, for example, a printed circuit (PC) board.

2. Description of the Related Art

Some devices, such as electronics devices, may require packaging to prevent exposure to an environment comprising one or more of air, moisture, salt, acid, or the like. For example, electronic devices utilized in systems for generating energy from renewable resources, such as solar power systems, wind farms, hydroelectric systems, or the like, may be exposed to environment elements and therefore require packaging. Such electronic devices may include printed circuit (PC) boards used in inverters, converters, power supplies, or the like.

Packaging materials may include polymers, such as polyurethane or epoxy, or other materials, such as silicone. One technique for packaging an electronic device may include potting the device in an enclosure. Potting may include, for example, placing the device in an enclosure, such as a metal or plastic box, and filling the box with a packaging material to encase the device and seal the device from air and environmental elements.

Unfortunately, an excess amount of packaging material beyond that required to seal the device from the environment is wasted during the potting process. Thus, the potting process is inefficient and unnecessarily expensive.

Therefore, there is a need in the art for an improved method and apparatus of potting electronic devices.

SUMMARY OF THE INVENTION

Embodiments of the present invention generally relate to a method and apparatus for potting an electronic device. In one embodiment, the method comprises providing an enclosure having a first inner volume with the electronic device disposed therein; placing a fill control element within the enclosure such that a second inner volume of the fill control element is fluidly coupled to the first inner volume; and filling a remaining portion of the first inner volume, the remaining portion not occupied by the electronic device or the fill control element, with a sealant such that air is trapped within at least a first portion of the second inner volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a flow diagram of a method for generating a potted assembly in accordance with some embodiments of the present invention.

Figure 1:
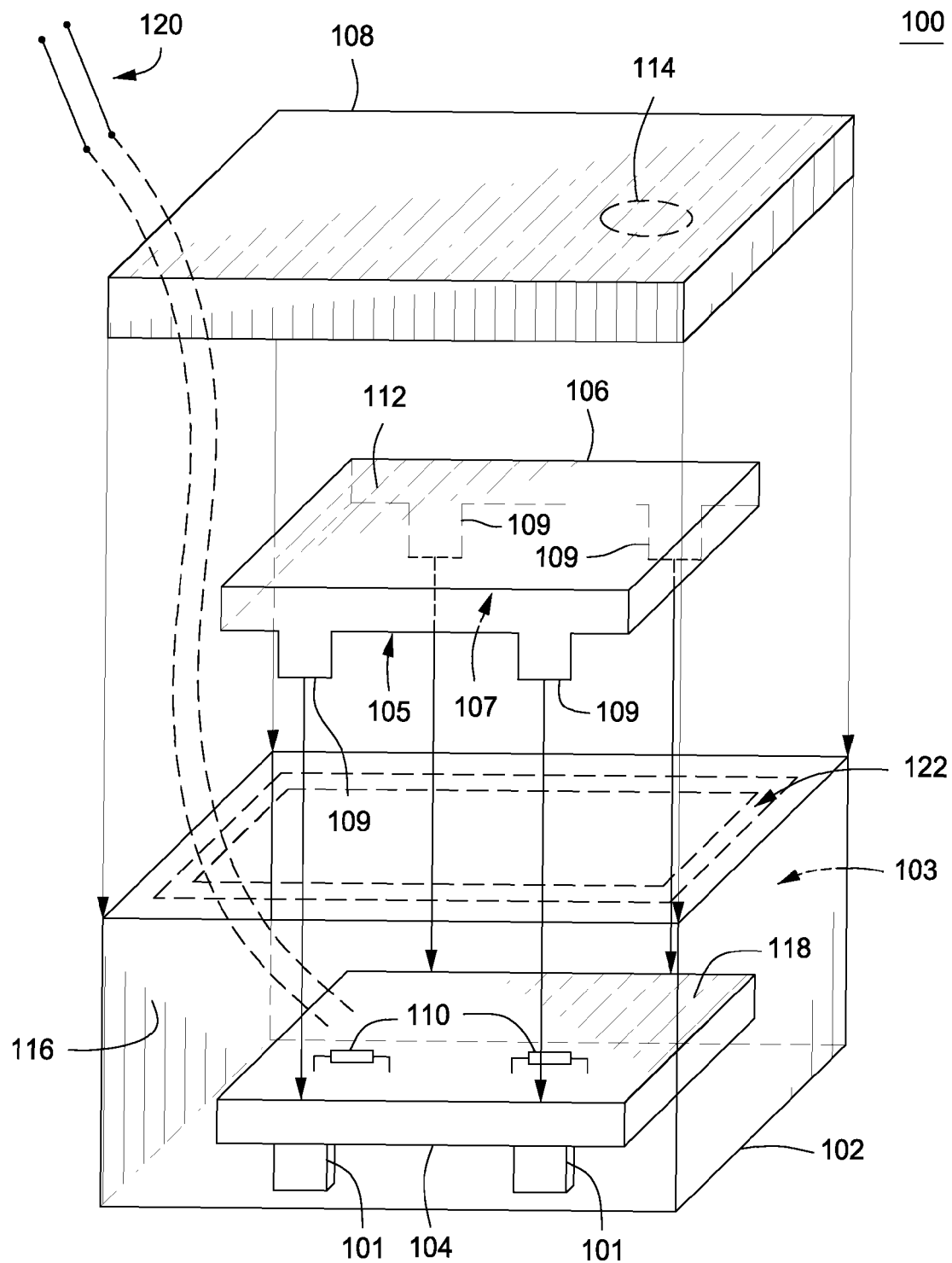
FIG. 1 depicts a perspective, exploded view of an assembly for potting an electronic device in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

A method and apparatus for potting an electronic device are provided herein. One embodiment of an inventive method may advantageously provide an efficient, cost effective technique for potting an electronic device, such as a printed circuit (PC) board or other suitable device by reducing the amount of sealant used in potting the device. One exemplary means of improved potting comprises a device enclosure and a fill control element.

FIG. 1 depicts a perspective, exploded view of an assembly 100 for potting an electronic device in accordance with some embodiments of the present invention. The assembly 100 includes an enclosure 102 having a first inner volume 103 with an electronic device 104 disposed therein. A fill control element 106 may be disposed atop the electronic device 104, where the fill control element 106 has a second inner volume 107 and an opening 105 that faces the electronic device 104. The opening 105 allows the first inner volume 103 to be fluidly coupled to the second inner volume 107; in some embodiments, a face of the fill control element 106 facing the electronic device 104 may comprise two or more openings for coupling the first and second inner volumes 103 and 107. The assembly 100 further includes a lid 108 disposed atop the enclosure 102.

The enclosure 102 may be any suitably sized enclosure for enclosing the electronic device 104. Although a rectangular shape is depicted in FIG. 1, to the enclosure 102 may be any other suitable shape for containing the electronic device 104, such as cylindrical, square, circular, oval, or the like. The enclosure 102 may be formed from metal, plastic, or a combination thereof. For example, in some embodiments the enclosure 102 may serve as an electromagnetic interference (EMI) shield and may therefore be formed at least partially from metal, such as steel, aluminum, or the like. In some alternative embodiments, the enclosure 102 may be formed from plastic when another component, such as the fill control element 106, is utilized as an EMI shield.

The electronic device 104 may be any suitable electronic device that requires potting to seal the device from potentially damaging elements, such as moisture, air, salt, acid, or the like. Exemplary devices may be, but are not limited to, PC boards that are used in inverters, converters, power supplies, or the like. The electronic device 104 includes electronic elements 110, such as capacitors, resistors, or the like, disposed, for example, on an upper surface of the electronic device 104.

The electronic device 104 may be disposed in the first inner volume 103 such that it does not come in contact with an inner wall 116 of the enclosure 102. Suitable means for keeping the electronic device 104 from contacting the inner wall 116 may include supports 101 having the electronic device 104 disposed thereon, or, alternatively, one or more members (not shown), extending from the inner wall 116, from which the electronic device 104 may be suspended. In one embodiment, the supports 101 and/or members are formed from any suitable material appropriate for contacting the device 104 in a non-conductive manner, such as plastic, polyurethane, or the like. In other embodiments, the supports 101 and/or members may be thermally conductive and/or electrically conductive.

The fill control element 106 is disposed above the device 104 as illustrated in FIG. 1. In some embodiments, the fill control element contacts (i.e., rests upon) an upper surface 118 of the device 104 via one or more feet 109 extending from the walls of the fill control element 106 at the opening 105. Although four feet 109 are illustrated in FIG. 1, any suitable number of feet 109 for disposing the fill control element 106 above the device 104 is possible; additionally or alternatively, other supporting structures may be utilized to maintain the fill control element 106 above the electronic device 104, such as plastic clips extending from the enclosure 102. When the fill control element 106 is maintained above (i.e., spaced apart from) the electronic device 104, the second inner volume 107 is fluidly coupled to the first inner volume 103 via the opening 105.

The fill control element 106 may be formed from metal, plastic, or a combination thereof. In some embodiments, where the enclosure 102 is formed from plastic, the fill control element 106 may be at least partially formed from metal, such as steel, aluminum, or the like, and utilized as an EMI shield. In some other embodiments, when the enclosure 102 comprises metal and is utilized as an EMI shield, the fill control element 106 may be formed from plastic.

Similar in scope to the enclosure 102, the fill control element 106 may be any suitable shape, for example, as dictated by the shape of the electronic device 104. Suitable shapes may include square, rectangular, cylindrical, oval, or the like.

The lid 108 may be disposed atop the enclosure 102 as illustrated in FIG. 1. The lid 108 may further contact an upper surface 112 of the fill control element 106 for the purpose of holding the fill control element 106 against the electronic device 104. In some embodiments, the upper surface 112 of the fill control element 106 may be adhered or permanently affixed to the lid 108.

The lid 108 may be formed from any suitable material, such as plastic or metal, and may be of any suitable shape to fit atop the enclosure 102. In some embodiments, the lid 108 may further include an aperture 114, e.g., a hole and/or opening, through which a sealant may be introduced after the lid 108 has been deposited atop the enclosure 102. The lid 108 may be fastened to the enclosure 102 by any suitable means including epoxy, screws, clips, fasteners, or the like.

The assembly 100 may further include one or more leads 120, disposed through the lid 108, for coupling one or more components of the electronic device 104 to one or more external power sources. The one or more leads 120 may be formed of any suitable conductive material, such as copper, aluminum, or the like. Optionally, in some embodiments, a lead frame 122 may be disposed atop the enclosure 102 and covered by the lid 108. The lead frame may include one or more leads for coupling one or more components of the electronic device 104 to one or more power sources external to the enclosure 102; additionally, the lead frame 122 may comprise an opening similar to the aperture 114 for introducing a sealant into the assembly 100.

In accordance with one or more embodiments of the present invention, a sealant may be introduced into the assembly 100 (i.e., into the enclosure 102) for substantially encapsulating the electronic device 104, as described in detail below. Such encapsulation of the electronic device 104 protects the electronic device 104 from contact with potentially damaging elements, such as air, moisture, salt, acid, or the like. Additionally, air trapped within the second inner volume of the fill control element during the introduction of the sealant advantageously reduces an amount of the sealant required to generate a potted assembly.

Figure 2A:
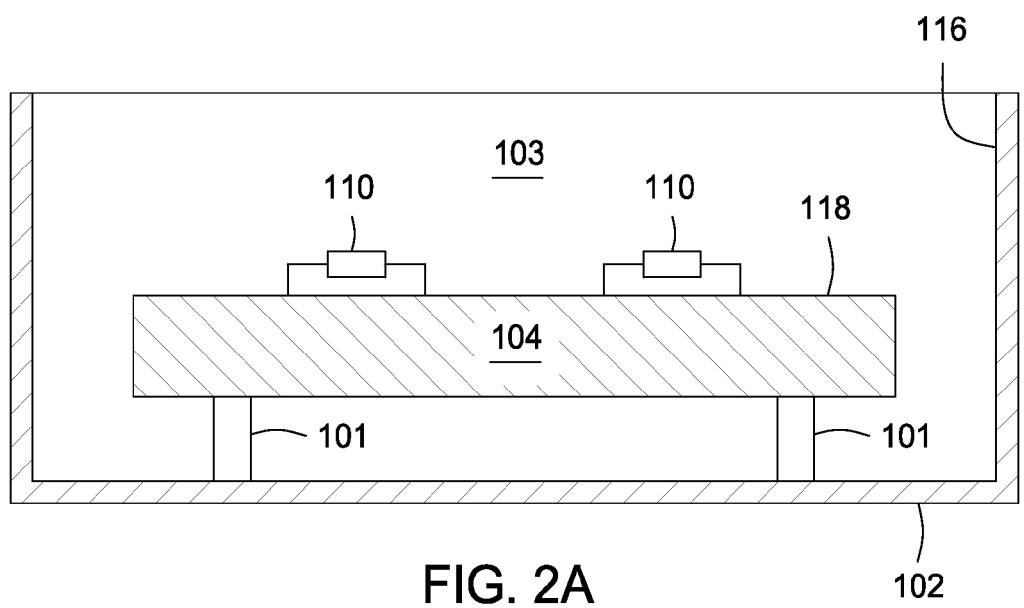
FIGS. 2A-2D together depict a procedure for generating a potted assembly in accordance with some embodiments of the present invention.

FIGS. 2A-2D together depict a procedure for generating a potted assembly 200 in accordance with some embodiments of the present invention. FIG. 2A depicts a cross-section view of the enclosure 102 having the first inner volume 103 with the electronic device 104 disposed therein. The electronic device 104 is suspended or supported within the inner volume 103 such that the electronic device 104 does not contact the inner wall 116 of the enclosure 102. As previously described, supports 101 maintain the electronic device 104 spaced apart from the inner wall 116 of the enclosure 102; additionally or alternatively, one or more members or other supports, such as plastic clips or the like, may be utilized to suspend the electronic device 104 within the enclosure 102.

Figure 2B:
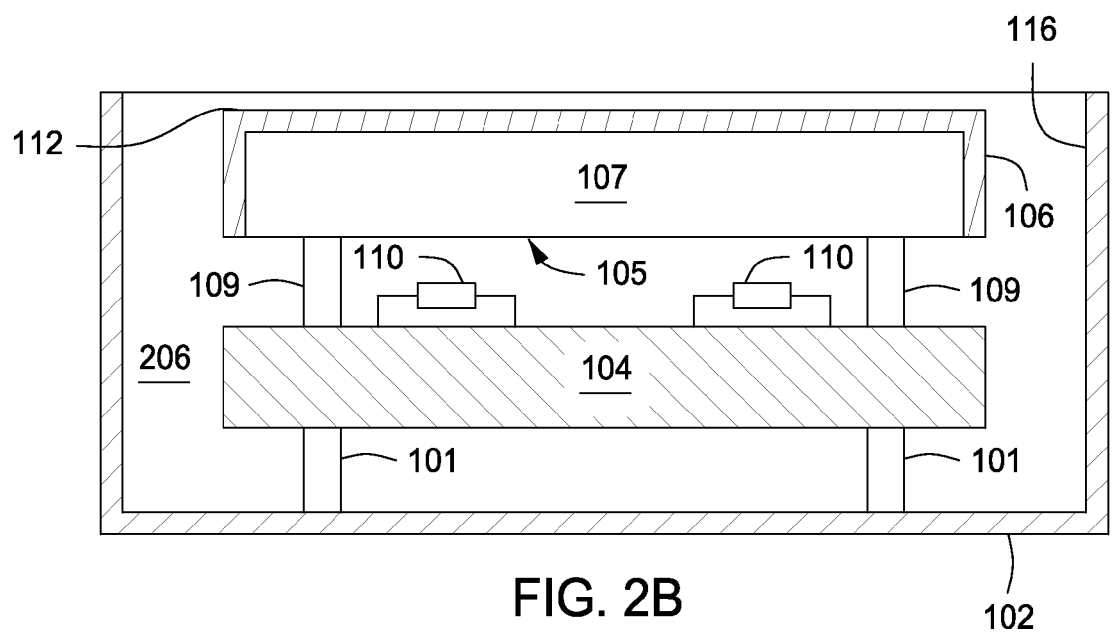

FIG. 2B depicts a cross-section view of fill control element 106 placed in the first inner volume 103. The fill control element 106 contacts (i.e., rests upon) the upper surface 118 of the device 104 via feet 109. In some embodiments, four feet 109 may extend from the walls of the fill control element 106 proximate the opening 105; alternatively, fewer or more feet 109 may be utilized for supporting the fill control element atop the electronic device 104. The feet 109 are of a size and shape such that the upper surface 112 of the fill control element 106 is approximately flush with the uppermost portion of the enclosure wall. In some embodiments, the fill control element 106 may be secured to the electronic device 104, for example, by adhesive on one or more of the feet 109, plastic clips, and/or other securing techniques.

With the positioning of the fill control element 106 above but spaced apart from the electronic device 104, the second inner volume 107 is fluidly coupled to the first inner volume 103 via the opening 105. Additionally, the fill control device 106 assumes a portion of the first inner volume 103, resulting in a remaining portion 206 of the first inner volume 103 (i.e., a portion of the first inner volume 103 that is not occupied by the electronic device 104 or the fill control element 106/second inner volume 107).

Figure 2C:
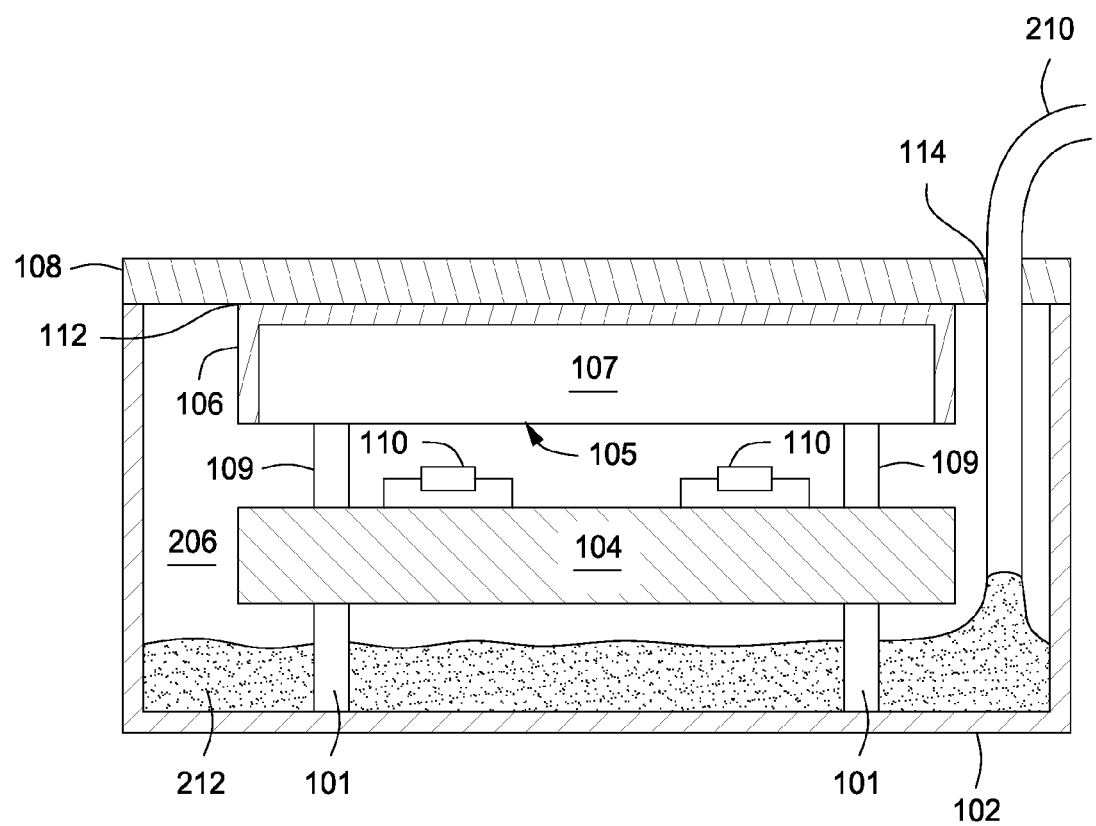

FIG. 2C depicts a fill process for introducing a sealant 212 into the enclosure 102. The lid 108 is placed atop the enclosure 102 and the fill process is initiated; in some alternative embodiments, the lid 108 may be placed atop the enclosure 102 subsequent to the fill process. A hose 210 may be inserted through the aperture 114 of the lid 108 for delivering the sealant 212 into the enclosure 102. The sealant 212 may include any suitable sealant material which prevents potentially damaging elements, such as moisture, salt, acid, or the like, from contacting the electronic device 104. Suitable sealant materials may include polyurethane, epoxy, silicone, or the like.

In some embodiments, an outlet of the hose 210 may be placed at the base of the enclosure 102, such that the sealant 212 enters the remaining portion 206 at the lowermost portion of the remaining portion 206. The sealant 212 may be introduced into the enclosure 102 in such a manner, for example, to force air, moisture, and the like out of the remaining portion 206 via the aperture 114 as the sealant level rises. As the sealant 212 fills the remaining portion 206, air becomes trapped in the second inner volume 107 of the fill control element 106 such that the trapped air cannot escape during the fill process. The trapped air prevents the sealant 212 from filling at least a portion (i.e., an unfilled portion 204) of the second inner volume 107 in which the trapped air resides. The unfilled portion 204, depicted as the portion of the second inner volume 107 disposed above a fill level 201 within the fill control device 106, advantageously reduces the amount of sealant 212 in the potted assembly 200 by a volume approximately equivalent to the unfilled portion 204 of the second inner volume 107. It is noted that the air trapped in the unfilled portion 204 of the second inner volume 107 does not contact the electronic device 104; i.e., the electronic device 104 is substantially encapsulated within the sealant 212.

Figure 2D:
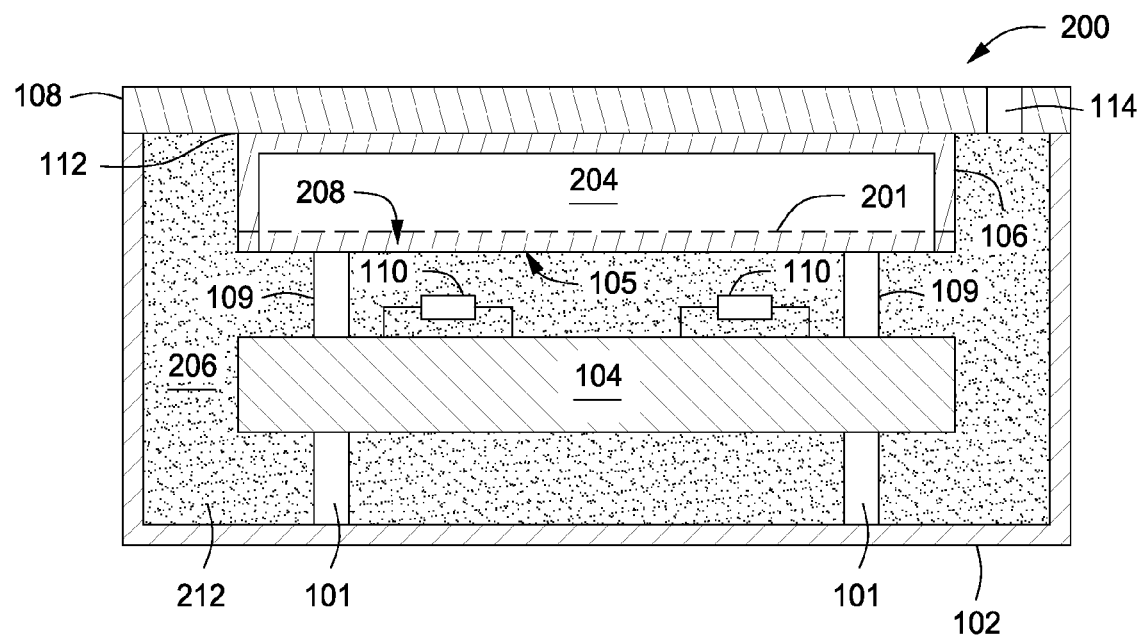

The fill process continues until the sealant 212 has substantially filled the remaining portion 206 of the first inner volume 103 to generate the potted assembly 200, as depicted in FIG. 2D. In addition, during the fill process, a small portion of the second inner volume 107 (i.e., a filled portion 208) may be filled to a level 201 by the sealant 212. The filled portion 208 extends from the opening 105 to the level 201, which represents a boundary between the filled and unfilled portions of the second inner volume 107.

Subsequent to filling the remaining portion 206 of the first inner volume 103 and the filled portion 208 of the second inner volume 107, the sealant 212 is hardened. The sealant 212 may be allowed to harden on its own (i.e., the sealant 212 may be self-curing), or the sealant 212 may be hardened by light, heat, or another suitable hardening means to form the potted assembly 200.

FIG. 3 is a flow diagram of a method 300 for generating a potted assembly in accordance with some embodiments of the present invention. The method 300 begins at 302 and proceeds to step 304. At step 304, an enclosure is provided, the enclosure having a first inner volume with an electronic device, such as a PC board, disposed therein. The enclosure is of a size and shape such that the electronic device is completely contained within the enclosure. The enclosure may be formed from plastic, metal, or a combination thereof. The electronic device is suspended or supported within the first inner volume such that the electronic device does not contact an inner wall of the enclosure. In some embodiments, the electronic device may rest upon one or more non-conductive supporting structures, such as supports 101, to maintain the electronic device spaced apart from the inner wall of the enclosure; additionally or alternatively, one or more non-conductive members or other supports, such as plastic clips or the like, may be utilized to suspend the electronic device within the enclosure.

The method 300 proceeds to step 306. At step 306, a fill control element having a second inner volume, such as fill control element 106 having seconding inner volume 107, is placed in the first inner volume. The fill control element may comprise one or more feet that rest on an upper surface of the electronic device and maintain the fill control element spaced apart from the electronic device; additionally, one or more other supports, such as plastic clips coupled to the enclosure or the like, may be utilized to maintain the fill control element atop the electronic device. In some embodiments, the fill control element may be secured in position, for example, by adhesive on the bottom of the feet and/or one or more other securing techniques.

The fill control element is of a size and shape such that, when residing atop the electronic device, an upper surface of the fill control element is approximately flush with the uppermost portion of the enclosure wall. The fill control element may be formed from metal, plastic, or a combination thereof. In some embodiments, for example where the enclosure is at least partially formed from metal and serves as an electromagnetic interference (EMI) shield, the fill control element may be formed from plastic. Alternatively, the fill control element may be at least partially formed from metal to serve as an EMI shield while the enclosure formed from plastic.

With the fill control element positioned above and spaced apart from the electronic device, the second inner volume is fluidly coupled to the first inner volume via one or more openings of the fill control element, the one or more openings facing the electronic device. Additionally, the fill control device assumes a portion of the first inner volume, resulting in a remaining portion of the first inner volume (i.e., a portion of the first inner volume that is not occupied by the electronic device or the fill control element/second inner volume).

The method 300 proceeds to step 308, where a fill process is initiated to introduce a sealant into the enclosure. A lid is placed atop the enclosure prior to initiating the fill process; in some alternative embodiments, the lid may be placed atop the enclosure subsequent to the fill process. The lid may be fastened to the enclosure by any suitable means including epoxy, screws, clips, fasteners, or the like. A hose is inserted through an aperture of the lid for delivering the sealant into the enclosure. The sealant may include any suitable potting material which prevents an environment comprising moisture, salt, acid, or the like from contacting the electronic device. Suitable sealant materials may include polyurethane, epoxy, silicone, or the like.

In some embodiments, an outlet of the hose may be placed at the base of the enclosure, such that the sealant enters the remaining portion of the first inner volume at its lowermost point. The sealant may be introduced into the enclosure in such a manner, for example, to force air, moisture, and the like out of the remaining portion of the first inner volume via the aperture as the sealant level rises.

As the sealant fills the remaining portion of the first inner volume, air becomes trapped in the second inner volume of the fill control element such that the trapped air cannot escape during the fill process. The trapped air prevents the sealant from filling at least a portion (i.e., an unfilled portion) of the second inner volume in which the trapped air resides. The unfilled portion of the second inner volume advantageously reduces the amount of sealant in the potted assembly by a volume approximately equivalent to the unfilled portion of the second inner volume. It is noted that the air trapped in the unfilled portion of the second inner volume does not contact the device; i.e., the electronic device is substantially encapsulated within the sealant.

The fill process continues until the sealant has substantially filled the remaining portion of the first inner volume; additionally, a small portion of the second inner volume (i.e., a filled portion) may be filled by the sealant. The filled portion of the second inner volume extends from the one or more openings of the fill control device to a fill control device fill level. The fill control device fill level represents a boundary between the filled and unfilled portions of the second inner volume.

The method 300 proceeds to step 310 where, subsequent to filling the remaining portion of the first inner volume and the filled portion of the second inner volume, the sealant is hardened. The sealant may be allowed to harden on its own (i.e., the sealant may be self-curing), or the sealant may be hardened by light, heat, or another suitable curing means to form the potted assembly. The method 300 then proceeds to step 312 where it ends.

A method and apparatus for potting an electronic device are provided herein. One embodiment of an inventive method may advantageously provide an efficient, cost effective means of potting an electronic device, such as a printed circuit (PC) board or other suitable device by reducing the amount of sealant used in potting the device.

While foregoing is directed to various embodiments of the present invention, other and further embodiments of the invention may be devised without departing from the basic scope thereof, and the scope thereof is determined by the claims that follow.

The invention claimed is:

1. A potted electronic device comprising:
 a container having an electronic device and a fill control element disposed therein; and
 a sealant that substantially fills an inner volume of the container except for a portion of the inner volume defined by the fill control element, wherein the sealant is not physically obstructed from entering the portion of the inner volume.

2. The potted electronic device of claim 1, wherein air is trapped within an inner volume of the fill control element.

3. The potted electronic device of claim 1, further comprising at least one support for maintaining the electronic device spaced apart from the container.

4. The potted electronic device of claim 1, wherein the sealant is at least one of epoxy, polyurethane, or silicone.

5. The potted electronic device of claim 1, further comprising a lid disposed atop the container.

6. The potted electronic device of claim 5, wherein the lid retains the fill control element against the electronic device.

7. The potted electronic device of claim 1, wherein the container is at least partially formed from metal and the fill control element is formed from plastic.

8. The potted electronic device of claim 1, wherein the container is formed from plastic and the fill control element is at least partially formed from metal.

9. The potted electronic device of claim 1, further comprising at least two electrical leads for coupling the electronic device to a device external to the container.

10. A potted electronic device comprising:
 a container having an electronic device and a fill control element disposed therein;
 a sealant that substantially fills an inner volume of the container except for a portion of the inner volume defined by the fill control element; and
 a lid disposed atop the container, wherein the lid retains the fill control element against the electronic device.

11. The potted electronic device of claim 10, wherein air is trapped within an inner volume of the fill control element.

12. The potted electronic device of claim 10, further comprising at least one support for maintaining the electronic device spaced apart from the container.

13. The potted electronic device of claim 10, wherein the sealant is at least one of epoxy, polyurethane, or silicone.

14. The potted electronic device of claim 10, further comprising at least two electrical leads for coupling the electronic device to a device external to the container.

15. A potted electronic device comprising:
 a container having an electronic device and a fill control element disposed therein; and
 a sealant that substantially fills an inner volume of the container except for a portion of the inner volume defined by the fill control element, wherein the container is formed from plastic and the fill control element is at least partially formed from metal.

16. The potted electronic device of claim 15, wherein air is trapped within an inner volume of the fill control element.

17. The potted electronic device of claim 15, further comprising at least one support for maintaining the electronic device spaced apart from the container.

18. The potted electronic device of claim 15, wherein the sealant is at least one of epoxy, polyurethane, or silicone.

19. The potted electronic device of claim 15, further comprising a lid disposed atop the container.

20. The potted electronic device of claim 19, wherein the lid retains the fill control element against the electronic device.

* * * * *